(12) United States Patent
Jeon et al.

(10) Patent No.: US 6,210,859 B1
(45) Date of Patent: Apr. 3, 2001

(54) COPOLYMER FOR THE MANUFACTURE OF CHEMICAL AMPLIFIED PHOTORESIST AND A POSITIVE PHOTORESIST COMPOSITION USING THE SAME

(75) Inventors: Hyun Pyo Jeon; Seong Ju Kim; Joo Hyeon Park; Jong Bum Lee, all of Taejon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 0 days.

(21) Appl. No.: 09/418,579

(22) Filed: Oct. 15, 1999

(51) Int. Cl.$^7$ .............................. G03C 1/73; C08F 16/02; C08F 16/38; C08F 26/02; C08F 26/06
(52) U.S. Cl. .................... 430/270.1; 430/905; 430/910; 430/914; 430/919; 430/920; 430/921; 430/925; 522/50; 522/75; 522/78; 522/79; 522/152; 522/154; 525/328.8; 526/260; 526/301
(58) Field of Search ................................ 526/301, 260; 525/328.8; 430/270.1, 326, 910, 919, 925, 906, 905, 914, 920, 921; 522/151, 152, 154, 50, 75, 78, 79

(56) References Cited

U.S. PATENT DOCUMENTS

| 5,110,888 | * | 5/1992 | Furukawa et al. ................ 526/312 |
| 5,558,976 | * | 9/1996 | Urano et al. ..................... 430/326 |
| 6,013,411 | * | 1/2000 | Aoai et al. ...................... 430/270.1 |

* cited by examiner

Primary Examiner—Cynthia Hamilton
Assistant Examiner—Sin J. Lee
(74) Attorney, Agent, or Firm—Birch, Stewart, Kolasch & Birch, LLP

(57) ABSTRACT

This invention relates to a copolymer for the manufacture of chemical amplified photoresist and a chemical amplified positive photoresist composition comprising a copolymer for the manufacture of chemical amplified photoresist as a base resin, as represented by the following formula 1, an acid generator and additive, Formula 1

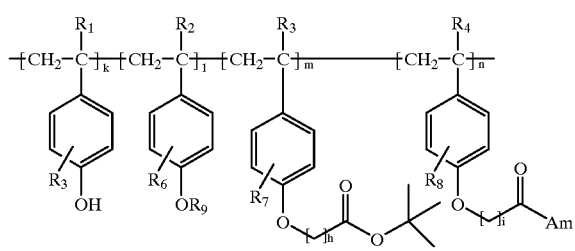

Wherein, $R_1$, $R_2$, $R_3$ and $R_4$ are independently a hydrogen atom or a lower alkyl group;

$R_5$, $R_6$, $R_7$ and $R_8$ are a hydrogen atom, an alkyl group of C1–8, an alkoxy group, an alkoxycarbonyl group or a halogen atom;

h and i are independently an integer of 0–8; k, l, m and n represent an integer of element units provided that $0.3 < k/(k+l+m+n) < 0.9$, $0 \leq l/(k+l+m+n) < 0.6$, $0 \leq m/(k+l+m+n) < 0.6$, and $0.01 < n/(k+l+m+n) < 0.3$, including $k+l+m+n=1$ and m may not become simultaneously zero, or are not simultaneously zero, $R_9$ is a compound represented by the following formula 2:

Formula 2

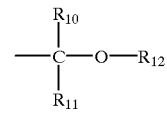

Wherein, $R_{10}$ and $R_{11}$ are independently a hydrogen atom, or an alkyl group of C1~6 with linear or branched chain;

$R_{12}$ is an alkyl group of C1~10 with linear, branched chain or cyclic form and hence, the detailed examples of alkyl group in linear or branched chain or cyclic form include methyl group, ethyl group, propyl group, isopropyl group, n-butyl group, isobutyl group, t-butyl group, while a cyclic alkyl group is cyclohyexyl group.

The detailed examples of acid-labile group represented by the above formula 2 include methoxyethyl group, ethoxyethyl group, n-butoxyethyl group, cyclohexyl group or methoxypropyl group.

Am is —$NR_{13}R_{14}$ (wherein, $R_{13}$ and $R_{14}$ are independently a hydrogen atom, an alkyl group of C18, an aryl group or a phenyl group), cyclic bivalent amines and a cyclic bivalent amines containing oxygen or sulfur atom.

Since the resins represented by the above formula 1 has different activation energy for deprotection each other, a photoresist composition containing such resins exhibits a higher resolution without being adversely affected by exposure to radiation or baking temperature after exposed. Further, the photoresist of this invention can demonstrate a variety of excellent physical properties such as sensitivity, resolution, heat-resistance and stability after exposure, and is capable of forming ultrafine patterns irrespective of any substrate.

10 Claims, No Drawings

US 6,210,859 B1

COPOLYMER FOR THE MANUFACTURE OF CHEMICAL AMPLIFIED PHOTORESIST AND A POSITIVE PHOTORESIST COMPOSITION USING THE SAME

BACKGROUND OF THE INVENTION

1. Field of the Invention

This invention relates to a copolymer for the manufacture of chemical amplified photoresist and a positive photoresist composition containing the copolymer and more particularly, to the chemical photoresist composition which can provide several advantages: a) ultrafine patterns can be formed irrespective of any substrate, b) a higher alkali-soluble contrast can be ensured before and after exposure, c) a larger scope of exposure can be obtained, and d) a variety of excellent physical properties such as sensitivity, resolution, heat-resistance and stability after exposure. In particular, the chemical amplified positive photoresist composition of this invention can be used as ultrafine patterns-forming material for ultra-LSI which can be sensitive to UV light, far ultraviolet ray, excimer laser, X-ray and electron beam.

2. Description of the Related Art

The recent semiconductor technology has been briskly in favor of more highly integrated chip and in parallel with this trend, ultrafine patterns having less than quarter-micron are required in the photolithography patterning designed to prepare an ultra-LSI. In this respect, since the exposure wavelength becomes more short in the conventional g-ray or i-ray, the research and development project for far ultraviolet ray, KrF excimer laser, X-ray and electron beam lithograph has drawn keen attention in the related field.

A photoresist used in the conventional g-ray or i-ray employs some Novolac-quinonediazide compounds. Since such photoresist applied to the wavelength of far ultraviolet ray or KrF excimer laser absorbs a lot of light, intensive researches have focused on a chemical amplified photoresist using polyhydroxystyrene derivatives which absorb less light than these Novolac-quinonediazide compounds.

The major principle of such chemical amplified photoresist composition is that the resist layer is exposed in patterns by chemical ray, some acid generator contained in the photoresist composition releases an acid which in turn triggers an catalytically active deprotection with a resin composition, thus changing the solubility to a developer solution.

In particular, since the chemical amplified photoresist composition may demonstrate an excellent catalytic activity on resin composition in the presence of a small amount of acid generated from an acid generator, its higher resolution in patterns and better sensibility on chemical ray may be ensured.

The examples of such chemical amplified photoresist material include poly(p-t-butoxycarbonyloxystyrene/p-hydroxystyrene; U.S. Pat. No. 4,491,628), poly(p-t-butoxystyrene/p-hydroxystyrene; U.S. Pat. No. 5,350,660) and poly(p-1-ethoxyethoxystyrene/p-hydroxystyrene, Japanese Patent No. A-5-249682).

However, if some protecting groups of base resin in the photoresist material are tert-butyl group or tert-butoxycarbonyl group, they are decomposed in strong acid which in turn becomes inactivated via reaction with basic compounds in the air. The resist material is liable to form a T-top, while having different patterns according to the types of substrate. Meantime, in case of some base resins having protective groups which are decomposed in weak acids such as acetal group or ketal group, their basic compounds are less affected in the air but the formation of patterns will be extremely narrowed due to time-relapse delay from exposure to radiation to thermal treatment (PEB), while being unsuitable for higher resolution.

SUMMARY OF THE INVENTION

To cope with some drawbacks of base resins used for the conventional chemical amplified photoresist composition, therefore, an object of this invention is to provide a novel copolymer for the manufacture of chemical amplified photoresist which can provide several advantages: a) a larger scope of exposure can be obtained, b) a variety of excellent physical properties such as sensitivity, resolution, heat-resistance and stability after exposure, and c) ultrafine patterns can be formed irrespective of any substrate.

Further object of this invention is to provide a chemical amplified positive photoresist composition using the copolymer with the aforementioned characteristics.

To achieve the above objective, the copolymer for the manufacture of chemical amplified photoresist of this invention is characterized by a copolymer represented by the following formula 1.

Formula 1

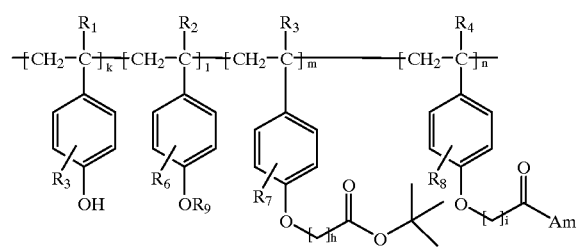

Wherein, $R_1$, $R_2$, $R_3$ and $R_4$ are independently a hydrogen atom or a lower alkyl group;

$R_5$, $R_6$, $R_7$ and $R_8$ are a hydrogen atom, an alkyl group of C1–8, an alkoxy group, an alkoxycarbonyl group or a halogen atom;

h and i are independently an integer of 0–8; k, l, m and n represent an integer of element units provided that $0.3 < k/(k+l+m+n) < 0.9$, $0 \leq l/(k+l+m+n) < 0.6$, $0 \leq m/(k+l+m+n) < 0.06$, and $0.01 < n/(k+l+m+n) < 0.3$, including $k+l+m+n=1$. l and m may not become simultaneously zero, or are not simultaneously zero.

$R_9$ is a compound represented by the following formula 2:

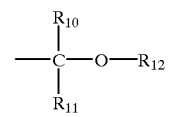

Wherein, $R_{10}$ and $R_{11}$ are independently a hydrogen atom, or an alkyl group of C1~6 with linear or branched chain;

$R_{12}$ is an alkyl group of C1~10 with linear, branched chain or cyclic form and hence, the detailed examples of alkyl group in linear or branched chain or cyclic form include methyl group, ethyl group, propyl group, isopropyl group, n-butyl group, isobutyl group, t-butyl group, while a cyclic alkyl croup is cyclohyexyl group.

The detailed examples of acid-labile group represented by the above formula 2 include methoxyethyl group, ethoxyethyl group, n-butoxyethyl group or methoxypropyl group.

Am is —$NR_{13}R_{14}$ (wherein, $R_{13}$ and $R_{14}$ are independently a hydrogen atom, an alkyl group of C1~8, an aryl group or a phenyl group), cyclic bivalent amines and a cyclic bivalent amines containing oxygen or sulfur atom.

Further, the chemical amplified positive photoresist composition of this invention is characterized by being prepared from a copolymer represented by the formula 1, acid generator and additive which are dissolved in an appropriate solvent.

DETAILED DESCRIPTION OF THE INVENTION

This invention is explained in more detail as set forth hereunder.

According to this invention, the preferred examples of base resin represented by the formula 1 are as follows:

(A) a quadrapolymer containing poly(hydroxystyrene/ alkoxyalkoxystyrene/t-butylcarbonylalkoxystyrene/ morpholinyl carbonylalkoxystyrene); k, l, m and n represent independently an integer of element units provided that $0.3 < k/(k+l+m+n) < 0.9$, $0 \leq l/(k+l+m+n) < 0.6$, $0 \leq m/(k+l+m+n) < 0.06$, and $0.01 < n/(k+l+m+n) < 0.3$;

(B) a terpolymer containing poly(hydroxystyrene/ alkoxyalkoxystyrene/ morpholinylcarbonylalkoxystyrene); k, l, m and n represent independently an integer of element units provided that $0.3 < k/(k+l+m+n) < 0.9$, $0 \leq l/(k+l+m+n) < 0.6$, m=0, and $0.01 < n/(k+l+m+n) < 0.3$;

(C) a terpolymer containing poly(hydroxystyrene/t-butylcarbonylalkoxystyrene/ morpholinylcarbonylalkoxystyrene);k, l, m and n represent independently an integer of element units provided that $0.3 < k/(k+l+m+n) < 0.9$, l=0, $0 < m/(k+l+m+n) < 0.6$, and $0.01 < n/(k+l+m+n) < 0.3$.

Among the three resins, one resin may be used as a base resin in the photoresist and if deemed necessary, two more resins may be employed.

Each component from the copolymer represented by the formula 1 has the following characteristics:

Hydroxy group serves to enhance the adhesiveness and heat-resisting property and sensitives; t-butoxycarbonylmethoxy group is converted to carboxylic acid or hydroxy group due to deprotection caused by the activity of acid when exposed to radiation; Ethoxyethoxy group is converted to hydroxy group deprotection caused by the activity of acid when exposed to radiation which results in enhancing the dissolution rate, thus ensuring a higher resolution;

Ethoxyethoxy group may easily form the patterns due to difference of solubility, since the deprotection occurs well in the process where a baking(PEB) temperature is 110° C. after exposure; Since t-butoxycarbonylmethoxy group has a better pattern and higher resolution, an appropriate mixing of the two substituents may ensure a photoresist which can have a higher resolution in the process at a lower baking temperature and may form ultrafine patterns, and Amide group maintains the affinity with acids generated during exposure to prevent the contact the basic components with acids in the air, while preventing the diffusion of acids to the adjacent area and narrowing of the patterns due to time delay after exposure. The amid group also serves to stabilize acids without any change in the activity of acids.

From the copolymer represented by the formula 1, it is preferred that the substitution amount of both t-butoxycarbonylmethoxy group and ethoxyethoxy group is in the range of 10~50%. while that of amide group is preferably in the range of 1~30%. If excess substitution amount of t-butoxycarbonylmethoxy group or ethoxyethoxy group is present, the sensitivity of photoresist becomes low but in case of less substitution amount is present, the difference of dissolution rate between the exposed and unexposed areas becomes small. In consideration of this, it is preferred that the substitution amount of both t-butoxycarbonylmethoxy group and ethoxyethoxy group is in the range of 20~40%, while that of amide group is most preferably in the range of 5~10%.

As such, the introduction of t-butoxycarbonylmethoxy group and amide group is performed via substitution between polyhydroxystyrene and alkylhalogen compounds and during this process, tetramethylammonium hydroxide should be added as a basic compound at all times.

The examples of alkylhalogen compound include morpholinyl bromoacetate and t-butyl bromoacetate.

It is preferred that the molecular weight of a base resin, so prepared, is in the range of 1,000~1,000,000 as polystyrene, most preferably in the range of 5,000~50,000.

In the process of formulating a photoresist composition using such copolymer, an acid generator and an additive in appropriate amount are added. Unless it does adversely affect the formation of resist patterns, while generating some acids when exposed to radiation, any materials may be used as an acid generator of this invention but it is more preferred to select some material which may maintain an appropriate photoabsorptivity at about 248 nm and transparency of resist material.

The preferred example of an acid generator with such properties includes a sulfonium compound represented by the following formula 3. However, the acid generator in the photoresist composition of this invention is not confined to the following compounds: Formula 3.

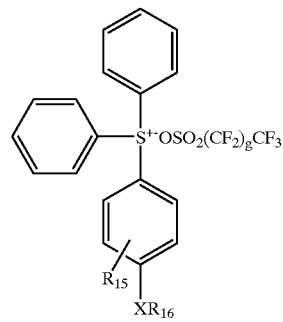

Wherein, $R_{15}$ is a hydrogen atom, alkyl group or alkoxy group;

$R_{16}$ is a hydrogen atom, an alkyl group, an alkoxyalkyl group or a t-butoxycarbonylmethyl group;

X is O, S or $CH_2$;

g is an integer of 0–20.

The detailed examples of compounds used as a acid generator represented by the formula 3 are as follows: triphenylsulfonium triflate, diphenyl(4-methylphenyl) sulfonium triflate, diphenyl(4-t-butylphenyl)sulfonium triflate, diphenyl(4-methoxyphenyl)sulfonium triflate, and diphenyl(4-t-butoxycarbonylmethoxyphenyl)sulfonium triflate.

In addition to the acid generator represented by the formula 3, the following compounds may be preferably used as an acid generator: triphenylsulfonium hexafluoroantimonate, diphenyliodonium triflate, diphenyliodonium methylbenzene sulfonate, phenyl(4-t-methoxyphenyl)iodonium camphor sulfonate. phenyl(4-t-butoxycarbonylmethoxyphenyl)iodonium caphor sulfonate, bis(cyclohexylsulfonyl)diazomethane, and bis(2,4-dimethylphenylsulfonyl)diazomethane.

The examples of halogen compound as an acid generator include 1,1-bis(4-chlorophenyl)-2.2.2-trichloroethane, phenyl-bis(trichloromethyl)-s-triazine, and naphtyl-bis (trichloromethyl)-s-triazine. In addition to these halogen compounds, the following compounds may be used as an acid generator: 1,3-diketo-2-diazo compound, diazobenzoquinone compound and diazonaphtoquinone compound as diazoketone compound; sulfone compound, sulfonic acid compound and nitrobenzyl compound. Among these acid generators, onium salts and diazoketone compounds are most preferred.

In case of these acid generators to the total photoresist composition, it is preferred to use 0.1–30 parts by weight in proportion to the total solid composition of 100 parts by weight, more preferably in the range of 0.1–10 parts by weight.

Meantime, one or more of acid generators may be employed.

According to the photoresist composition of this invention, some compounds designed to facilitate the dissolution rate of a developer solution after being dissolved in acid may be used, if deemed necessary. The examples of this compound includes compounds where an aromatic polyhydroxy compound is protected by t-butoxycarboxyl group, acetal group or ketal group. When these compounds are added for the manufacture of a photoresist, it is preferred to use 5–80 parts by weight in proportion to the total solid composition of 100 parts by weight, more preferably in the range of 10–50 parts by weight.

According to the photoresist composition of this invention, some additives may be used. The examples of these additives include a surfactant, azo compound, antihalation agent, adhesive supplemental agent, storage stabilizer and defoaming agent.

The examples of surfactant include polyoxylauryl ether, polyoxyethylene stearyl ether, polyoxyethylene oleyl ether, polyoxyethylene octyl phenol ether, polyoxyethylene nonyl phonol ether or polyethylene glycol dilaurate. From the photoresist composition, it is preferred that the amount of the surfactant is in the range of less than 2 parts by weight in proportion to the total solid composition of 100 parts by weight.

In addition to the above component, the positive photoresist composition of this invention may contain an adsorbent designed to enhance the sensitivity or resolution. It is preferred to use benzophenone or naphtoquinone compounds as an adsorbent. It is preferred that the amount of the adsorbent is in the range of 0.2–30 parts by weight in proportion to the total solid composition of 100 parts by weight, more preferably in the range of 0.5–10 parts by weight.

Further, to prevent the diffusion of acid generated after exposure, some basic compounds such as amine or ammonium compounds may be employed. The detailed examples of such basic compounds include triphenyl amine, tetramethylammonium hydroxide, tetramethylammonium acetate, triethyl amine, triethanol amine, diphenyl amine, pyridine, dipyridyl or N,N-dimethyl acetamide. It is preferred that the amount of basic compound is in the range of 0.05–5 parts by weight in proportion to the total solid composition but in case of exceeding the above amount, the diffusion rate of acid may be reduced but with poor sensitivity.

According to this invention, some acid compounds may be selectively used in the photoresist composition. The detailed examples of such acid compounds include some organic acids such as phthalic acid, succinic acid, malonic acid, benzoic acid, salicylic acid, m-hydroxybenzoic acid, p-hydroxybenzoic acid, o-acetylbenzoic acid, o-acetyloxybenzoic acid, o-nitrobenzoic acid, thiosalicylic acid and thionicotinic acid, salicylaldehyde, salicylhydrooxamic acid, succinimide, phthalimide and ascorbic acid, including a polymer expressed by the following formula 4. It is preferred that the amount of acid compound is in the range of 0.05~5 parts by weight in proportion to the total solid composition but in case of exceeding the above amount, the patterns may be biased. Formula 4

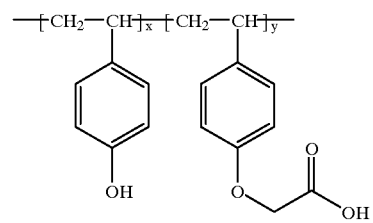

Wherein, $0.01 < (y/(x+y)) \leq 0.4$; the weight average molecular weight of the polymer as polystyrene is in the range of 500–50,000, preferably in the range of 5,000–20,000.

The photoresist composition of this invention is dissolved in an appropriate solvent prior to use. To obtain a homogenous and planar film for application, a solvent with appropriate evaporation rate and viscosity is used. The detailed examples of solvent with such characteristics are as follows: ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, propylene glycol monomethyl ether acetate, propylene glycol monoethyl ether acetate, propylene glycol monopropyl ether acetate, methylethyl ketone, cyclohexanone, methyl 2-hydroxypropionate, ethyl 2-hydroxypropionate, 2-heptanone, N-methyl pyrrolidone, N, N-dimethylformamide, N, N-dimethylacetamide, ethyl pyruvate, n-amylacetate, ethyl lactate and gamma-butyrolactone. If situations permit, one or more of the solvent may be employed. The amount of solvent is adjusted according to its physical properties such as volatility and viscosity, thus forming it on the wafer homogeneously.

The composition of this invention prepared in solution is applied and dried on the wafer substrate, thus forming a photoresist fragment. The application method is that after a resist solution is prepared and filtered, the solution is applied to the substrate in the methods of rotation, flowing or rolling.

The photoresist film, so applied via such method, is partially exposed to radiation for forming ultrafine patterns. The radiation is not specifically confined but the detailed examples of radiation include i-ray as UV light, excimer laser as far ultraviolet ray, X-ray, and electron beam as charge particle ray. Such radiation may be used according to the types of acid generator. After radiation, the photoresist film may be treated by heat for enhancing its sensitivity.

A developer solution used in final stage of forming patterns is selected from some aqueous solution consisting of sodium hydroxide, potassium hydroxide, sodium carbonate, sodium silicate, metasodium silicate, ammonia water, ethylamine, n-propylamine, triethylamine, tetramethylanmnonium hydroxide and tetraethylammonium hydroxide. Among these developer solutions, it is in particular preferred to use tetramethylammonium hydroxide. If deemed necessary surfactant and water-soluble alcohols may be used as an additive.

This invention is explained in more detail based on the following examples but is not limited by these examples.

SYNTHESIS EXAMPLE 1

Preparation of poly(hydroxystyrene/morpholinylcarbonylmethoxystyrene)

A 25% tetramethylammonium hydroxide aqueous solution (58 g) was added to polyhydroxystyrene (250 g) in a co-solvent (2 L) consisting of acetone and water. With the addition of morpholinyl bromoacetate (22 g), the reacting mixture was stirred for 10 hours. 33 ml hydrochloric acid was added to the reacting solution for neutralization, followed by dropwise adding into 20 L distilled water to obtained a white solid. The solid, so formed, was filtered off, washed with distilled water for dehydration and dissolved again in acetone. Then, the reacting solution was precipitated and washed in distilled water for dehydration and drying. Thus, the resin, so obtained, was 253 g of poly(hydroxystyrene/morpholinylcarbonylmethoxystyrene) having the weight average molecular weight of 12,500 as polystyrene, in which 5% of hydroxy groups in polyhydroxystyrene was substituted into morpholinylcarbonylmethoxy group.

SYNTHESIS EXAMPLE 2

Preparation of poly(hydroxystyrene/morpholinylcarbonylmethoxystyrene)

A copolymer was prepared in the same procedure as Synthesis example 1, except that 25% tetramethylammonium hydroxide in aqueous solution (116 g) and morpholinyl bromoacetate (44 g) were added to a reacting solution, respectively. Thus, a resin (250 g) where 10% of hydroxy groups in polyhydroxystyrene was substituted into morpholinylcarbonylmethoxy group was synthesized. The resin, so obtained, was 250g of poly(hydroxystyrene/morpholinylcarbonylmethoxystyrene) having the weight average molecular weight of 13,200 as polystyrene.

SYNTHESIS EXAMPLE 3

Preparation of poly(hydroxystyrene/t-butoxycarbonylmethoxystyrene/morpholinylcarbonylmethoxystyrene A 25% tetramethylammonium hydroxide aqueous solution (90 g) was added to polyhydroxystyrene (100 g) in a co-solvent (1.5 L) consisting of acetone and water. With the addition of t-butyl bromoacetate (16 g) and morpholinyl bromoacetate (9 g), the reacting mixture was stirred for 10 hours. 26 ml hydrochloric acid was added to the reacting solution for neutralization, followed by dropwise adding into 15 L distilled water to obtained a white solid. The solid, so formed, was filtered off, washed with distilled water for dehydration and dissolved again in acetone. Then, the reacting solution was precipitated and washed in distilled water for dehydration and drying. Thus, the resin, so obtained, was 111 g of poly(hydroxystyrene/t-butoxycarbonylmethoxystyrene/morpholinylcarbonylmethoxystyrene) having the weight average molecular weight of 13,500 as polystyrene, in which 8.4% of hydroxy groups in polyhydroxystyrene was substituted into t-butoxycarbonylmethoxy group, while 5% of hydroxy groups into morpholinylcarbonylmethoxy group.

SYNTHESIS EXAMPLE 4

Preparation of poly(hydroxystyrene/t-butoxycarbonylmethoxystyrene/morpholinylcarbonylmethoxystyrene)

A 25% tetramethylammonium hydroxide aqueous solution (120 g) was added to polyhydroxystyrene (100 g) in a co-solvent (1.5 L) consisting of acetone and water. With the addition of t-butyl bromoacetate (40 g) and morpholinyl bromoacetate (9 g), the reacting mixture was stirred for 10 hours. 35 ml hydrochloric acid was added to the reacting solution for neutralization, followed by dropwise adding into 15 L distilled water to obtained a white solid. The solid, so formed, was filtered off, washed with distilled water for dehydration and dissolved again in acetone. Then, the reacting solution was precipitated and washed in distilled water for dehydration and drying. Thus, the resin, so obtained, was 117g of poly(hydroxystyrene/t-butoxycarbonylmethoxystyrene/morpholinylcarbonylmethoxystyrene) having the weight average molecular weight of 15.200 as polystyrene, in which 23.5% of hydroxy groups in polyhydroxystyrene was substituted into t-butoxycarbonylmethoxy group, while 5% of hydroxy groups into morpholinylcarbonylmethoxy group.

SYNTHESIS EXAMPLE 5

Preparation of poly(hydroxystyrene/t-butoxycarbonylmethoxystyrene/morpholinylcarbonylmethoxystyrene A copolymer was prepared in the same procedure as Synthesis example 4, except that 25% tetramethylammonium hydroxide in aqueous solution (126 g) and t-butylbromoacetate (49 g) were added to a reacting solution, respectively. Thus, a resin, so obtained, was 250g of poly(hydroxystyrene/t-butoxycarbonylmethoxystyrene/ morpholinylcarbonylmethoxystyrene) having the weight average molecular weight of 15,700 as polystyrene, in which 28.5% of hydroxy groups in polyhydroxystyrene was substituted into t-butoxycarnonylmethoxy group, while 5% of hydroxy groups into morpholinylcarbonylmethoxy group.

SYNTHESIS EXAMPLE 6

Preparation of poly(hydroxystyrene/ ethoxyethoxystyrene/ morpholinylcarbonylmethoxystyrene)

50g of poly(hydroxystyrene/ morpholinylcarbonylmethoxystyrene) where 5% of hydroxy groups was substituted into morpholinylcarbonylmethoxy group, so obtained from Synthesis example 1, was dissolved in 500 ml dimethyl formamide. With the addition of p-toluene sulfonic acid in catalytic amount, the reacting mixture was stirred at 20° C., followed by the addition of ethylvinyl ether (17 g). After reaction for 1 hour, the mixture was neutralized with pyridiene, followed by dropwise adding into 5 L water to obtain a white solid. The solid, so formed, was filtered off, washed with distilled water for dehydration and dissolved again in acetone. Then the reacting solution dropwise added into 5 L water for filtration and washed, for dehydration and drying. Thus, a resin, so obtained, was 51 g of poly(hydroxystyrene/ ethoxyethoxystyrene/morpholinylcarbonylmethoxystyrene) having the weight average molecular weight of 14,100 as polystyrene, in which 27% of hydroxy groups in polyhydroxystyrene was substituted into ethoxyethoxy group, while 5% of hydroxy groups into morpholinylcarbonylmethoxy group.

SYNTHESIS EXAMPLE 7

Preparation of poly(hydroxystyrene/ ethoxyethoxystyrene/ morpholinylcarbonylmethoxystyrene)

A copolymer was prepared in the same procedure as Synthesis example 6, except that ethylvinyl ether (18.5 g) was added. Thus, a resin, so obtained, was 50g of poly (hydroxystyrene/ethoxyethoxystyrene/ morpholinylcarbonylmethoxystyrene) having the weight average molecular weight of 14,400 as polystyrene, in which 32% of hydroxy groups in polyhydroxystyrene was substituted into ethoxyethoxy group, while 5% of hydroxy groups into morpholinylcarbonylmethoxy group.

SYNTHESIS EXAMPLE 8

Preparation of poly(hydroxystyrene/ ethoxyethoxystyrene/ morpholinylcarbonylmethoxystyrene)

A copolymer was prepared in the same procedure as Synthesis example 6, except that ethylvinyl ether (20 g) was added. Thus, a resin, so obtained, was 52g of poly (hydroxystyrene/ethoxyethoxystyrene/ morpholinylcarbonylmethoxystyrene) having the weight average molecular weight of 14,700 as polystyrene, in which 37% of hydroxy groups in polyhydroxystyrene was substituted into ethoxyethoxy group, while 5% of hydroxy groups into morpholinylcarbonylmethoxy group.

SYNTHESIS EXAMPLE 9

Preparation of poly(hydroxystyrene/ ethoxyethoxystyrene/ morpholinylcarbonylmethoxystyrene)

50g of poly(hydroxystyrene/ morpholinylcarbonylmethoxystyrene) where 10% of hydroxy groups was substituted into morpholinylcarbonylmethoxy group, so obtained from Synthesis example 2, was dissolved in 500 ml dimethyl formamide. With the addition of p-toluene sulfonic acid in catalytic amount, the reacting mixture was stirred at 20° C. followed by the addition of ethylvinyl ether (15.5 g). After reaction for 1 hour, the mixture was neutralized with pyridine, followed by dropwise adding into 5 L water to obtain a white solid. The solid, so formed, was filtered off, washed with distilled water for dehydration and dissolved again in acetone. Then, the reacting solution injected into 5 L water for filtration and washed, for dehydration and drying. Thus, a resin, so obtained, was 51 g of poly(hydroxystyrene/ethoxyethoxystyrene/ morpholinylcarbonylmethoxystyrene) having the weight average molecular weight of 14,500 as polystyrene, in which 22% of hydroxy groups in polyhydroxystyrene was substituted into ethoxyethoxy group, while 10% of hydroxy groups into morpholinylcarbonylmethoxy group.

SYNTHESIS EXAMPLE 10

Preparation of poly(hydroxystyrene/ ethoxyethoxystyrene/ morpholinylcarbonylmethoxystyrene)

A copolymer was prepared in the same procedure as Synthesis example 9, except that ethylvinyl ether (16.9 g) was added. Thus, a resin, so obtained, was 50g of poly (hydroxystyrene/ethoxyethoxystyrene/ morpholinylcarbonylmethoxystyrene) having the weight average molecular weight of 14,700 as polystyrene, in which 26% of hydroxy groups in polyhydroxystyrene was substituted into ethoxyethoxy group, while 10% of hydroxy groups into morpholinylcarbonylmethoxy group.

SYNTHESIS EXAMPLE 11

Preparation of poly(hydroxystyrene/ ethoxyethoxystyrene/ morpholinylcarbonylmethoxystyrene)

A copolymer was prepared in the same procedure as Synthesis example 9, except that ethylvinyl ether (18 g) was added. Thus, a resin, so obtained, was 50g of poly (hydroxystyrene/ethoxyethoxystyrene/ morpholinylcarbonylmethoxystyrene) having the weight average molecular weight of 15,100 as polystyrene, in which 31% of hydroxy groups in polyhydroxystyrene was substituted into ethoxyethoxy group, while 10% of hydroxy groups into morpholinylcarbonylmethoxy group.

SYNTHESIS EXAMPLE 12

Preparation of poly(hydroxystyrene/ ethoxyethoxystyrene/t- butoxycarbonylmethoxystyrene/ morpholinylcarbonylmethoxystyrene)

50g of poly(hydroxystyrene/t- butoxycarbonylmethoxystyrene/ morpholinylcarbonylmethoxystyrene) where 8.4% of hydroxy groups in polyhydroxystyrene was substituted into t-butoxycarbonylmethoxy group and 5% of hydroxy groups into morpholinylcarbonylmethoxy group, so obtained from Synthesis example 3, was dissolved in 500 ml dimethyl formamide. With the addition of p-toluene sulfonic acid in catalytic amount, the reacting mixture was stirred at 20° C., followed by the addition of ethylvinyl ether (14 g). After reaction for 1 hour, the mixture was neutralized with pyridine, followed by dropwise adding into 5 L water to obtain a white solid. The solid, so formed, was filtered off, washed with distilled water for dehydration and dissolved again in acetone. Then, the reacting solution dropwise added into 5 L water for filtration and washed, for dehydration and drying. Thus, a resin, so obtained, was 52g of poly(hydroxystyrene/ethoxyethoxystyrene/t-butoxycarbonylmethoxystyrene/morpholinocarbonyl lmethoxystyrene) having the weight average molecular weight of 14,400 as polystyrene, in which 16% of hydroxy groups in polyhydroxystyrene was substituted into ethoxyethoxy group, 8.4% of hydroxy groups into t-butoxycarbonylmethoxy group and 5% of hydroxy groups into morpholinylcarbonylmethoxy group.

SYNTHESIS EXAMPLE 13

Preparation of poly(hydroxystyrene/ethoxyethoxystyrene/t-butoxycarbonylmethoxystyrene/morpholinylcarbonylmethoxystyrene)

A copolymer was prepared in the same procedure as Synthesis example 12, except that ethylvinyl ether (15.5 g) was added. Thus, a resin, so obtained, was 50 g of poly(hydroxystyrene/ethoxyethoxystyrene/t-butoxycarbonylmethoxystyrene/morpholinocarbonyl lmethoxystyrene) having the weight average molecular weight of 14,800 as polystyrene, in which 21% of hydroxy groups in polyhydroxystyrene was substituted into ethoxyethoxy group, 8.4% of hydroxy groups into t-butoxycarbonylmethoxy group and 5% of hydroxy groups into morpholinylcarbonylmethoxy group.

SYNTHESIS EXAMPLE 14

Preparation of poly(hydroxystyrene/ethoxyethoxystyrene/t-butoxycarbonylmethoxystyrene/morpholinylcarbonylmethoxystyrene)

A copolymer was prepared in the same procedure as Synthesis example 12, except that ethylvinyl ether (17 g) was added. Thus, a resin, so obtained, was 54 g of poly(hydroxystyrene/ethoxyethoxystyrene/t-butoxycarbonylmethoxystyrene/morpholinocarbonyl lmethoxystyrene) having the weight average molecular weight of 15,000 as polystyrene, in which 25% of hydroxy groups in polyhydroxystyrene was substituted into ethoxyethoxy group, 8.4% of hydroxy groups into t-butoxycarbonylmethoxy group and 5% of hydroxy groups into morpholinylcarbonylmethoxy group.

SYNTHESIS EXAMPLE 15

Preparation of acid compound

A 25% tetramethylammonium hydroxide aqueous solution (120 g) was added to polyhydroxystyrene (100 g) in a co-solvent (1 L) consisting of acetone and water. With the addition of bromoacetic acid (40 g), the reacting mixture was stirred for 10 hours. 100 ml acetic acid was added to the reacting solution for neutralization, followed by dropwise adding into 10 L distilled water to obtained a white solid. The solid, so formed, was filtered off, washed with distilled water for dehydration and dissolved again in acetone. Then, the reacting solution was precipitated and washed in distilled water for dehydration and drying. Thus, the acid compound 1 represented by the following equation was obtained.

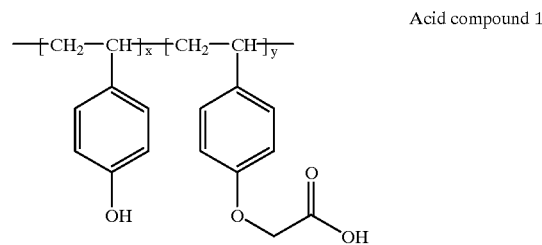

Acid compound 1

Weight average molecular weight (Mw): 5,000 as polystyrene

Molecular weight distribution (Mw/Mn) 1.8 y/(x+y)=0.35

Chemical composition, molecular weight distribution of polyhydroxystyrene and weight average molecular weight (Mw) of the copolymer represented by the above formular 1, so obtained from Synthesis examples were shown in the following table 1.

TABLE 1

| Synthesis Example | chemical composition (molar ratio) | | | | A | B |
|---|---|---|---|---|---|---|
| | k | l | m | n | | |
| 4 | 71.5 | — | 23.5 | 5 | 1.15 | 15,200 |
| 5 | 66.5 | — | 28.5 | 5 | 1.15 | 15,700 |
| 6 | 68 | 27 | — | 5 | 1.15 | 14,100 |
| 7 | 63 | 32 | — | 5 | 1.16 | 14,400 |
| 8 | 58 | 37 | — | 5 | 1.16 | 14,700 |
| 9 | 68 | 22 | — | 10 | 1.20 | 14,500 |
| 10 | 64 | 26 | — | 10 | 1.16 | 14,700 |
| 11 | 59 | 31 | — | 10 | 1.10 | 15,100 |
| 12 | 70.6 | 16 | 8.4 | 5 | 1.10 | 14,400 |
| 13 | 65.6 | 21 | 8.4 | 5 | 1.10 | 14,800 |
| 14 | 61.6 | 25 | 8.4 | 5 | 1.16 | 15,000 |

Notes.
A: Molecular weight distribution of polyhydroxystyrene
B: Weight average molecular weight of copolymer

Example 1–18

Some resist materials comprising the polymer compounds, so obtained from Synthesis example as base resin, as shown in the above table 1, photoacid generators, basic compounds, surfactants and aromatic carboxylic acids, as illustrated in the following table 2, were dissolved in an appropriate solvent to prepare resist solutions in the chemical composition as described in the following table 3.

TABLE 2

| acid penetrator | formula | acid penetrator | formula |
| --- | --- | --- | --- |
| PAG 1 | triphenylsulfonium triflate with p-OCH₃ substituent | PAG 2 | triphenylsulfonium triflate with p-OCH₂C(=O)O-tBu substituent |
| PAG 3 | triphenylsulfonium triflate with p-SCH₃ substituent | PAG 4 | triphenylsulfonium triflate with p-SCH₂C(=O)O-tBu substituent |

TABLE 3

| | chemical composition of resist (part by weight) | | | | |
| --- | --- | --- | --- | --- | --- |
| Examples | base resin (synthesis Exam.) (mixing ratio) | acid penerator | basic compound | acid compound 1 | organic solvent |
| 1 | 6/5(60/40) | PAG2(3) | diphenyl-amine(0.9) | 1.0 | PGMEA(500) |
| 2 | 7/4(70/30) | PAG2(3) | TEA(0.09) | 1.0 | PGMEA(500) |
| 3 | 8/4(80/20) | PAG2(3) | TEA(0.09) | 1.0 | PGMEA(500) |
| 4 | 9/5(60/40) | PAG2(3) | TEA(0.09) | 1.0 | PGMEA(500) |
| 5 | 10/4(70/30) | PAG2(3) | diphenyl-amine(0.9) | 1.0 | PGMEA(500) |
| 6 | 11/4(80/20) | PAG2(3) | N,N-dimethyl-acetamide(1.0) | 1.0 | PGMEA(500) |
| 7 | 12/5(50/50) | PAG2(3) | N,N-dimethyl-acetamide(1.0) | 1.0 | PGMEA(500) |
| 8 | 13/4(60/40) | PAG2(3) | diphenyl-amine(0.9) | 1.0 | PGMEA(500) |
| 9 | 14/4(70/30) | PAG2(3) | N,N-dimethyl-acetamide(1.0) | 1.0 | PGMEA(500) |
| 10 | 6/11/4(20/50/30) | PAG1(3) | diphenyl-amine(0.9) | 1.0 | PGMEA/EL (500) |
| 11 | 7/10/4(35/35/30) | PAG1(3) | TEA(0.09) | 1.0 | PGMEA/EL (500) |
| 12 | 8/9/5(50/20/30) | PAG4(3) | triethanol amine(0.05) | 1.0 | PGMEA/EL (500) |
| 13 | 6/14/4(30/50/20) | PAG1(3) | triethanol amine(0.05) | 1.0 | PGMEA(500) |
| 14 | 7/13/5(40/30/30) | PAG4(3) | triethanol amine(0.05) | 1.0 | PGMEA(500) |
| 15 | 8/12/4(50/20/30) | PAG4(3) | TEA(0.09) | 1.0 | PGMEA/EL (500) |

TABLE 3-continued

| Examples | base resin (synthesis Exam.) (mixing ratio) | acid penerator | basic compound | acid compound 1 | organic solvent |
|---|---|---|---|---|---|
| 16 | 9/14/5(20/50/30) | PAG3(3) | N,N-dimethyl-acetamide(1.0) | 1.0 | PGMEA/EL (500) |
| 17 | 10/13/5(30/30/40) | PAG3(3) | diphenyl-amine(0.9) | 1.0 | PGMEA/EL (500) |
| 18 | 11/12/4(30/30/40) | PAG3(3) | TEA(0.09) | 1.0 | PGMEA(500) |

Notes.
TEA: Triethylamine,
PGMEA: propylene glycol monomethylether acetate
PGMEA/EL: solution of mixture propyleneglycol monomethylether acetate/ethyl lactate (350/150)

Each composition was filtered using a filter membrane of 0.1 μl in size to obtain a resist solution. The resist was applied using a spinner to give a film of 0.7 μm in thickness in a baking process at 90° C. for 90 seconds. The film was exposed by pattern chrome mask using a 248nm KrF excimer laser staffer, baked at 110° C. for 90 seconds and developed with a 2.38% tetramethylammonium hydroxide aqueous solution by weight for 60 minutes. After being dried, positive resist patterns were formed.

When the both top side of line and space is same with the bottom side by 1:1 from the resist patterns, the exposed amount was determined as an optimum level of exposure energy (sensitivity). From the sensitivity level, the minimum ray width was also determined as a resolution for assessment thereof.

Meantime, to evaluate the resolution, resist materials was exposed in the same manner as above and measured at different baking time (PED) for 30 minutes and 2 hours, respectively.

Further, the resist patterns was observed using a scanning electronic microscope (SEM).

The results were shown in the following table 4.

TABLE 4

| | Sensitivity | Resolution | | | |
|---|---|---|---|---|---|
| Examples | (Eop) (mJ/cm$^2$) | 0 | PED 30 mins. | PED 2 hrs. | pattern profile |
| 1 | 24.0 | 0.18 | 0.18 | 0.18 | rectangular |
| 2 | 20.0 | 0.20 | 0.20 | 0.20 | rectangular |
| 3 | 22.0 | 0.20 | 0.20 | 0.20 | rectangular |
| 4 | 30.0 | 0.20 | 0.20 | 0.20 | rectangular |
| 5 | 28.0 | 0.18 | 0.18 | 0.18 | rectangular |
| 6 | 30.0 | 0.18 | 0.18 | 0.18 | rectangular |
| 7 | 29.0 | 0.18 | 0.18 | 0.18 | slightly lozenge |
| 8 | 26.0 | 0.18 | 0.18 | 0.18 | slightly lozenge |
| 9 | 28.0 | 0.18 | 0.18 | 0.18 | slightly lozenge |
| 10 | 40.0 | 0.19 | 0.19 | 0.19 | rectangular |
| 11 | 37.0 | 0.19 | 0.19 | 0.19 | rectangular |
| 12 | 22.0 | 0.19 | 0.19 | 0.19 | rectangular |
| 13 | 40.0 | 0.20 | 0.20 | 0.20 | rectangular |
| 14 | 23.0 | 0.20 | 0.20 | 0.20 | rectangular |
| 15 | 21.0 | 0.19 | 0.19 | 0.19 | rectangular |
| 16 | 32.0 | 0.18 | 0.18 | 0.18 | slightly lozenge |
| 17 | 34.0 | 0.19 | 0.19 | 0.19 | slightly lozenge |
| 18 | 31.0 | 0.20 | 0.20 | 0.20 | slightly lozenge |

From the above table 3, it was noted that the patterns formed by the photoresist of this invention proved to have a higher resolution with better improved stability in that the size of patterns remained unchanged regardless of baking time. In case of the pattern profiles, the patterns formed by the photoresist of this invention were in general excellent, even though some slightly lozenge-shaped patterns were occasionally formed.

As described in the above, the chemical amplified positive resist material containing specific copolymer according to this invention has several advantages in that a) ultrafine patterns can be formed irrespective of any substrate, b) a higher alkali-soluble contrast can be ensured before and after exposure, c) a larger scope of exposure can be obtained, and d) a variety of excellent physical properties such as sensitivity, resolution, heat-resistance and stability after exposure. In particular, the chemical amplified positive photoresist composition of this invention can be used as ultrafine patterns-forming material for ultra-LSI which can be sensitive to UV light, far ultraviolet ray, excimer laser, X-ray and electron beam.

What is claimed is:

1. A copolymer for the manufacture of a chemically amplified photoresist having a weight average molecular weight ranging from 1,000 to 1,000,000 as polystyrene, as represented by the following formula 1, Formula 1

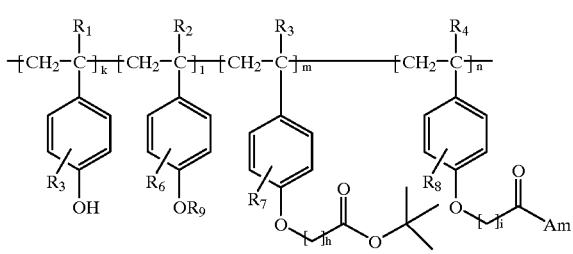

Wherein, $R_1$, $R_2$, $R_3$ and $R_4$ are independently a hydrogen atom or a lower alkyl group;

$R_5$, $R_6$, $R_7$ and $R_8$ are a hydrogen atom, an alkyl group of C1-8, an alkoxy group, an alkoxycarbonyl group or a halogen atom;

h and i are independently an integer of 0–8; k, l, m and n represent an integer of element units provided that $0.3 < k/(k+l+m+n) < 0.9$, $0 \leq l/(k+l+m+n) < 0.6$, $0 \leq m/(k+l+m+n) < 0.6$, and $0.01 < n/(k+l+m+n) < 0.3$, including $k+l+m+n=1$ and l and m may not become simultaneously zero, or are not simultaneously zero, $R_9$ is a compound represented by the following formula 2:
Formula 2

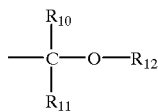

Wherein, $R_{10}$ and $R_{11}$ are independently a hydrogen atom, or an alkyl group of C1~6 with linear or branched chains;

$R_{12}$ is an alkyl group of C1~10 with a linear, a branched chain or a cyclic form;

Am is $-NR_{13}R_{14}$ (wherein, $R_{13}$ and $R_{14}$ are independently a hydrogen atom, an alkyl group of C1~8, an aryl group or a phenyl group), cyclic bivalent amines or cyclic bivalent amines containing oxygen or sulfur atoms.

2. The copolymer according to claim 1, wherein said copolymer represented by the above formula 1 is prepared by selecting one or more compounds from the following groups;

(A) a quadrapolymer containing poly(hydroxystyrene/alkoxyalkoxystyrene/t-butoxycarbonylalkoxystyrene/morpholinyl carbonylalkoxystyrene); k, l, m and n represent independently an integer of element units provided that $0.3 < k/(k+l+m+n) < 0.9$, $0 \leq l/(k+l+m+n) < 0.6$, $0 \leq m/(k+l+m+n) < 0.06$, and $0.01 < n/(k+l+m+n) < 0.3$;

(B) a terpolymer containing poly(hydroxystyrene/alkoxyalkoxystyrene/morpholinylcarbonylalkoxystyrene); k, l, m and n represent independently an integer of element units provided that $0.3 < k/(k+l+m+n) < 0.9$, $0 \leq l/(k+l+m+n) < 0.6$, m=0, and $0.01 < n/(k+l+m+n) < 0.3$;

and (C) a terpolymer containing poly(hydroxystyrene/t-butoxylcarbonylalkoxystyrene/morpholinylcarbonylalkoxystyrene); k, l, m and n represent independently an integer of element units provided that $0.3 < k/(k+l+m+n) < 0.9$, l=0, $0 \leq m/(k+l+m+n) < 0.6$, and $0.01 < n/(k+l+m+n) < 0.3$.

3. The copolymer according to claim 1, wherein h is 1 and wherein the t-butoxycarbonylmethoxy group and the amide group are introduced via substitution between polyhydroxystyrene and alkylhalogen compound with the addition of tetramethylammonium hydroxide as a basic compound.

4. The copolymer of claim 1, wherein the alkyl group of $R_{12}$ in linear, branched chain or cyclic form is selected from the group consisting of methyl, ethyl, propyl, isopropyl, n-butyl, isobutyl, t-butyl and cyclohexyl.

5. The copolymer of claim 1, wherein the acid-labile group represented by Formula 2 includes a methoxyethyl group, an ethoxyethyl group, and n-butoxyethyl group, or a methoxypropyl group.

6. Chemical amplified positive photoresist composition prepared in such a manner that a copolymer covered by claim 1, acid generator and additive are dissolved in a solvent.

7. The composition according to claim 6, wherein one or more of said acid generator is selected from the following group consisting of triphenylsulfonium hexafluoroantimonate, diphenyliodonium triflate, diphenyliodonium methylbenzene sulfonate, phenyl(4-t-methoxyphenyl)iodonium camphor sulfonate, phenyl(4-t-butylacetylphenyl)iodonium camphor sulfonate, bis(cyclohexylsulfonyl)diazomethane, bis(2,4-dimethylphenylsulfonyl)diazomethane, 1,1-bis(4-chlorophenyl)-2,2,2-trichloroethane, phenyl-bis(trichloromethyl)-s-triazine, naphtyl-bis(trichloromethyl)-s-triazine and sulfonium compound represented by the following formula 3:

Formula 3

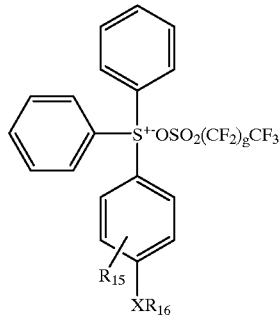

wherein, $R_{15}$ is a hydrogen atom, alkyl group or alkoxy group;

$R_{16}$ is an alkyl group, an alkoxyalkyl group or a t-butoxycarbonylmethyl group;

X is O, S or $CH_2$;

g is an integer of 0–20.

8. The composition according to claim 6, wherein an acid compound represented by the polymer of following formula 4 is added to said composition

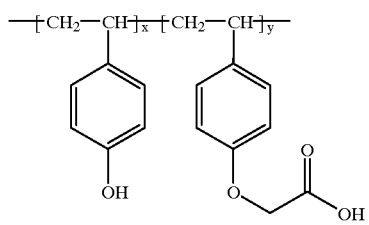

Formula 4 wherein, $0.01 < y/(x+y) \leq 0.4$; the weight average molecular weight of the polymer as polystyrene is in the range of 500–50,000.

9. The composition of claim 8, wherein the weight average molecular weight of the polymer as polystyrene is in the range of 5,000–20,000.

10. The composition according to claim 6, wherein said additive includes surfactant, azo compound, anti-halation agent, adhesive supplemental agent, storage stabilizer or defoaming agent.

\* \* \* \* \*